(12) United States Patent
Syroiezhin et al.

(10) Patent No.: US 12,438,455 B2
(45) Date of Patent: *Oct. 7, 2025

(54) REGULATED CHARGE PUMP WITH ADAPTIVE DRIVE STRENGTH

(71) Applicant: Infineon Technologies AG, Neubiberg (DE)

(72) Inventors: Semen Syroiezhin, Erlangen (DE); Andreas Baenisch, Grünwald (DE); Stephan Leuschner, Linz (AT); Andreas Wickmann, Nuremberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,158

(22) Filed: Feb. 19, 2024

(65) Prior Publication Data

US 2024/0195296 A1 Jun. 13, 2024

Related U.S. Application Data

(63) Continuation of application No. 17/807,526, filed on Jun. 17, 2022, now Pat. No. 11,936,293.

(51) Int. Cl.
*H02M 3/07* (2006.01)
*H03K 5/24* (2006.01)
*H03K 19/20* (2006.01)

(52) U.S. Cl.
CPC ............... *H02M 3/07* (2013.01); *H03K 5/24* (2013.01); *H03K 19/20* (2013.01)

(58) Field of Classification Search
None
See application file for complete search history.

(56) References Cited

U.S. PATENT DOCUMENTS

| | | |
|---|---|---|
| 6,128,242 A | 10/2000 | Banba et al. |
| 6,765,428 B2 | 7/2004 | Kim et al. |
| 9,577,626 B2 | 2/2017 | Crandall et al. |
| 9,634,560 B2 | 4/2017 | Ek |
| 10,879,797 B2 | 12/2020 | Chang et al. |
| 10,931,193 B2 | 2/2021 | Tokuda et al. |
| 10,972,003 B2 | 4/2021 | Lin |
| 11,296,599 B1 | 4/2022 | Golara et al. |
| 2010/0052771 A1 | 3/2010 | Hartono |

(Continued)

FOREIGN PATENT DOCUMENTS

| | | |
|---|---|---|
| CN | 105634268 A | 6/2016 |
| CN | 109412408 A | 3/2019 |
| EP | 2979354 A1 | 2/2016 |

*Primary Examiner* — Jeffrey S Zweizig
(74) *Attorney, Agent, or Firm* — Slater Matsil, LLP

(57) ABSTRACT

A regulated charge pump includes a comparator having a first input coupled to an output of the regulated charge pump, a second input configured for receiving a reference voltage, and an output for generating an output voltage representing a difference between a charging current of the regulated charge pump and a load current of a load coupled to the output of the regulated charge pump; a first converter having an input coupled to the output of the comparator, and an output connected to a control bus configured to indicate an adjustment of the charging current in response to the comparator output; and a driving stage having a first input coupled to the control bus, and an output for providing the charging current, wherein the output of the driving stage comprises the output of the regulated charge pump.

20 Claims, 9 Drawing Sheets

(56) References Cited

U.S. PATENT DOCUMENTS

2011/0109376 A1 5/2011 Li
2018/0204101 A1 7/2018 De Jongh et al.
2020/0366193 A1 11/2020 Chang et al.

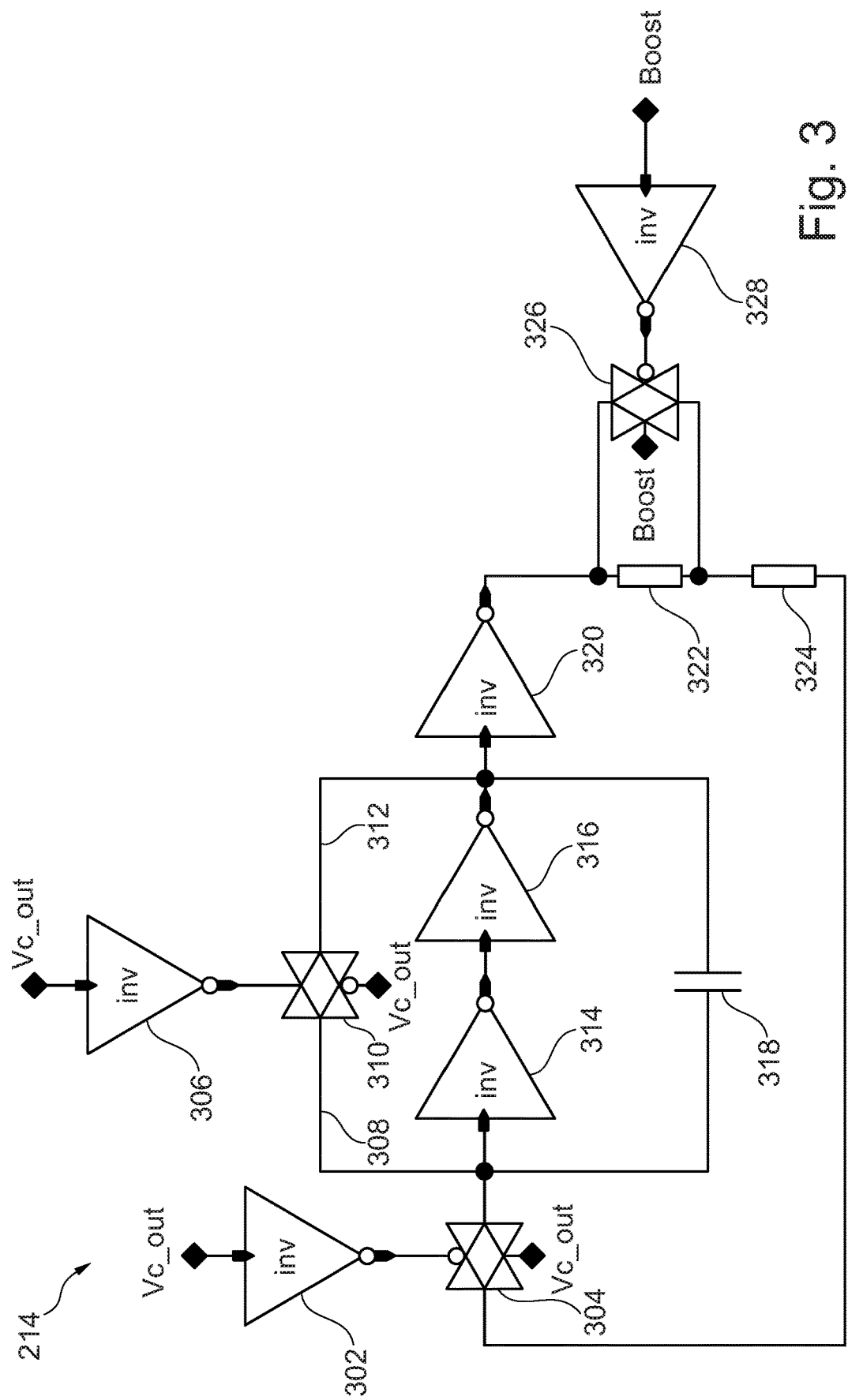

REGULATED CHARGE PUMP WITH ADAPTIVE DRIVE STRENGTH

This application is a continuation of U.S. patent application Ser. No. 17/807,526, entitled "Regulated Charge Pump with Adaptive Drive Strength," filed on Jun. 17, 2022, which application is incorporated herein by reference.

TECHNICAL FIELD

The present invention relates generally to a regulated charge pump with adaptive drive strength, and, in particular embodiments, to a corresponding system and method.

BACKGROUND

Charge pumps are known in the art. Charge pumps are typically used to convert a voltage that is available to an integrated circuit via an input pin into an internal voltage that is a higher or lower voltage than a pin voltage that is not available. Charge pumps typically include a plurality of pumping stages each comprising either a transistor and a capacitor, or a diode and a capacitor, in series configuration, wherein the last pumping stage provides the boosted output voltage to an internal integrated circuit node. The capacitors in the pumping stages of the charge pump are sometimes referred to as "flying capacitors." The final capacitor of the charge pump is coupled between the load and ground and is sometimes referred to as a "blocking capacitor." The capacitors in the pumping stages typically receive alternating clock signals for proper operation to build up the final boosted voltage. The pumping stages are usually arranged in an open loop configuration that may result in the boosted output voltage having a noticeable amount of ripple. Regulated charge pumps are also known in the art to provide a charge pump having less ripple by using a feedback path from the output to an input comparator, as well as using the open loop charge pump described above. State of the art regulated charge pumps, however, require a significant amount of capacitance at the output terminal. Larger integrated circuit capacitors are sometimes used for providing the increased capacitance for decreasing the ripple and for generating a more stable output voltage. While there are benefits from a regulated charge having large integrated circuit capacitors, there are also corresponding costs from a significant increase in total integrated circuit area.

SUMMARY

According to an embodiment, a regulated charge pump comprises a comparator having a first input coupled to an output of the regulated charge pump, a second input configured for receiving a reference voltage, and an output for generating an output voltage representing a difference between a charging current of the regulated charge pump and a load current of a load coupled to the output of the regulated charge pump; a first converter having an input coupled to the output of the comparator, and an output connected to a control bus configured to indicate an adjustment of the charging current in response to the comparator output; and a driving stage having a first input coupled to the control bus, and an output for providing the charging current, wherein the output of the driving stage comprises the output of the regulated charge pump.

According to an embodiment, a regulated charge pump comprises a comparator having a first input and a second input for receiving a reference voltage; a clock generator having an input coupled to an output of the comparator; a first open-loop charge pump in a first feedback path having an input coupled to a first output of the clock generator, and an output coupled to the second input of the comparator; and a second open-loop charge pump in a second feedback path having an input coupled to a second output of the clock generator, and an output coupled to the second input of the comparator, wherein the output of the first open-loop charge pump and the output of the second open-loop charge pump comprises an output of the regulated charge pump.

According to an embodiment, a method comprises comparing a charge pump output voltage to a reference voltage to generate an enable signal; generating a first clock signal and a second clock signal in response to the enable signal; generating the charge pump output voltage with a first charge pump responsive to the first clock signal; counting a number of periods of the second clock signal; and boosting a driving strength of the first charge pump with a second charge pump, wherein a number of pumping stages of the second charge pump are enabled according to the number of periods that are counted.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a schematic diagram of a clock signal generator for use in the regulated charge pump of FIG. 2;

DETAILED DESCRIPTION OF ILLUSTRATIVE EMBODIMENTS

Figure 1:
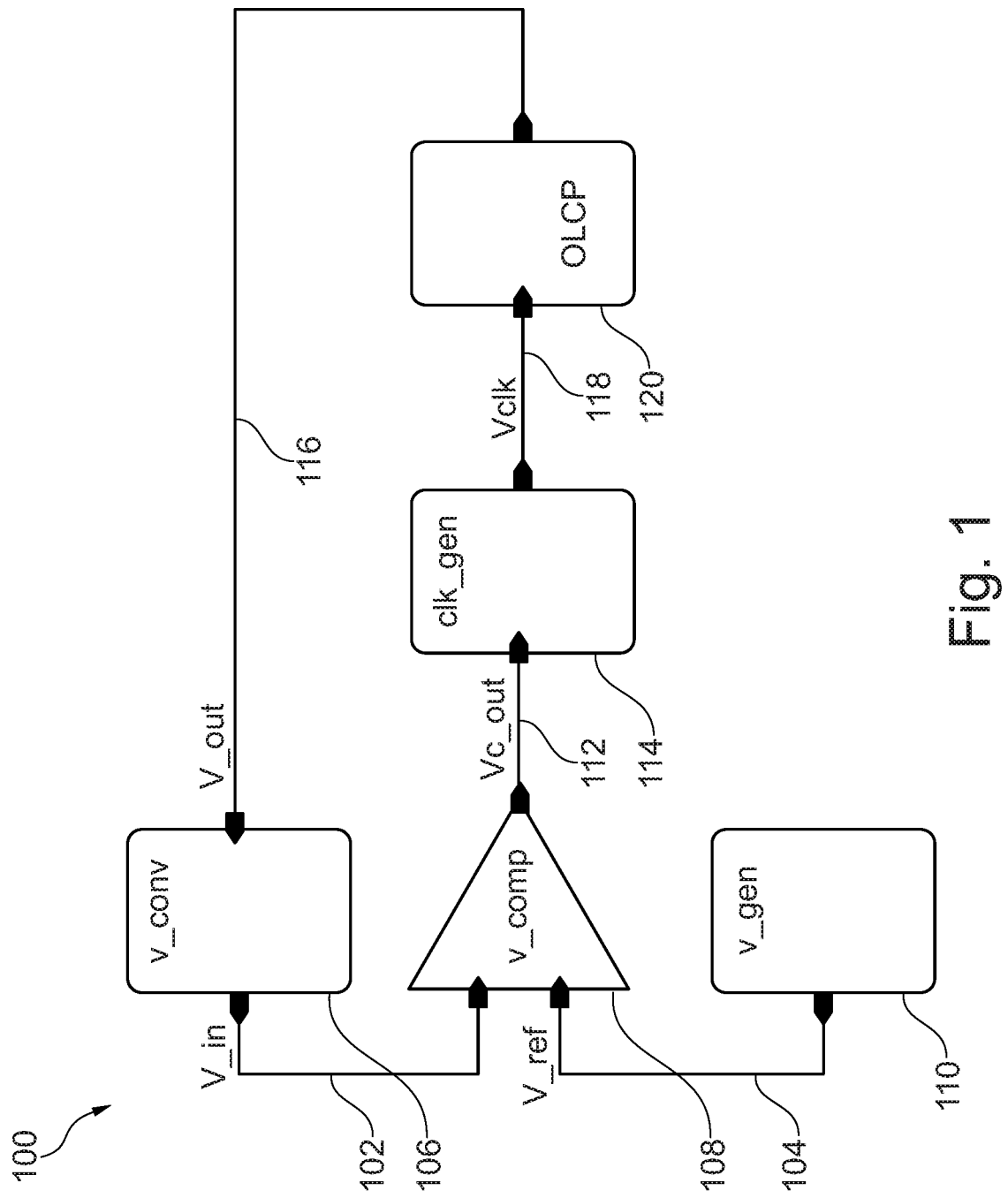
FIG. 1 is a schematic diagram of an exemplary regulated charge pump.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown byway of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

There is a precise ratio between charge injected into the output node by the load current and the charge injected into the output node by the charging circuitry of a charge pump. Typically used digitally regulated (pulse-skipping) charge pump approaches are limited by the following equations, wherein:

$$V_{ripple} \sim VDD \frac{C_{fl}}{C_{blk}} \sim VDD \frac{I_{max}}{C_{blk} \cdot f_{max}}$$

$$\Delta V \sim \frac{\tau_{del} \cdot I_{load}}{C_{blk}}$$

$V_{ripple}$ is the residual periodic variation of the DC output voltage of the charge pump (ripple voltage);
$\Delta V$—is the change in the output voltage due to load current;
$C_{fl}$—is the capacitance of the flying capacitors of the pumping stages;
$I_{max}$ is the maximum output current of the charge-pump;
$C_{blk}$—is the capacitance of the blocking capacitor;
$f_{max}$ is the maximum frequency of the clock signal that is received by the pumping stage;
VDD—is the supply voltage of the pumping stage;
$\tau_{del}$—internal delay of the control circuit (feedback loop); and
$I_{load}$—load current.

As previously discussed, ripple can be reduced by increasing the value of the blocking capacitor. While other regulated charge pump approaches are known, some of these approaches require compensation, which slows down operation of the charge pump and creating high internal delays and consequently a larger $\Delta V$ value.

According to embodiments, a regulated charge pump includes additional circuitry in order to advantageously achieve high driving capabilities, low drop-in voltage, low power consumption, low ripple and independently small integrated circuit area as is discussed in further detail below.

According to embodiments, a regulated charge pump includes both a first feedback loop and a second feedback loop, in which charge that comes to the output node of the charge pump during a single clock cycle is controlled. In an embodiment, one of the feedback loops provides a variable driving strength and the other of the feedback loops provides a fixed driving strength. The amount of charge is controlled by a digital regulation of the number of active pumping stages. In addition, the output voltage drop is kept small during large load current spikes when the blocking capacitor is small. This is possible due to an internal boost signal generation that speeds up the charge pump comparator and clock speed in order to decrease response time and further increasing driving strength.

According to embodiments, the number of enabled pumping stages of the regulated charge pump is adaptive to load conditions, i.e. the number of pumping stages increases as the load current demands increase. An up-down counter counts periods of clock signal pulses depending on the state of the comparator. When the comparator output is high then the counter adds unities to its output value which leads to increasing of the number of active pumping stages. An opposite action happens when the comparator output is low. A BOOST digital signal is implemented in order to make a low-power charge pump comparator faster during driving of a high load with a higher number of active pumping stages. This allows overshoots of the output voltage to be advantageously decreased. The BOOST signal switches to high value when the comparator output is high longer than an intentionally implemented digital delay. The BOOST signal can be also used to speed-up the clock signal to the flying capacitors. In addition, the BOOST signal can be used for a harder separation of the steady state mode and the high-power mode. Its value depends on the output value of the counter and the delayed comparator output signal. When all the inputs are low the BOOST signal becomes low as well and disables the boosting activity as well as the counter. However, when at least one of the input signals is high the boost signal enables the counter and boosting. These and other features of the regulated charge pump, according to embodiments, are described in detail below.

FIG. 1 is a schematic diagram of an exemplary regulated charge pump 100 including an open loop charge pump 120, previously described. In addition, exemplary regulated charge pump 100 includes a voltage converter 106, a voltage comparator 108, a voltage generator 110, and a clock signal generator 114. The voltage comparator compares an input voltage (V_in) at node 102 to a voltage reference (V_ref) at node 104, and generates a voltage comparator output signal (Vc_out) at node 112 based on the comparison. The voltage comparator output signal is a digital signal having a first value if the input voltage is greater than the voltage reference, and a second value if the input voltage is less than the voltage reference. The clock signal generator 114 receives the voltage comparator output signal at node 112. Clock signal generator 114 is enabled with the digital signal at node 112, which can also be designated an enable signal. A voltage clock signal (Vclk) is generated at node 118 in response to the enable signal at node 118. Node 118 is also the clock input node of the open loop charge pump 120, previously described. The voltage output (V_out) of the open loop charge pump 120 is selectively generated at node 116. Node 116 is also an input to voltage converter 106. Voltage converter generates a voltage at node 102 that is a linear function of the voltage at node 116, which may also include an offset voltage. Finally, the voltage reference is generated by voltage generator 110 at node 104. Voltage generator 110 may be a bandgap voltage generator or any other suitable voltage reference generator.

Figure 2A:
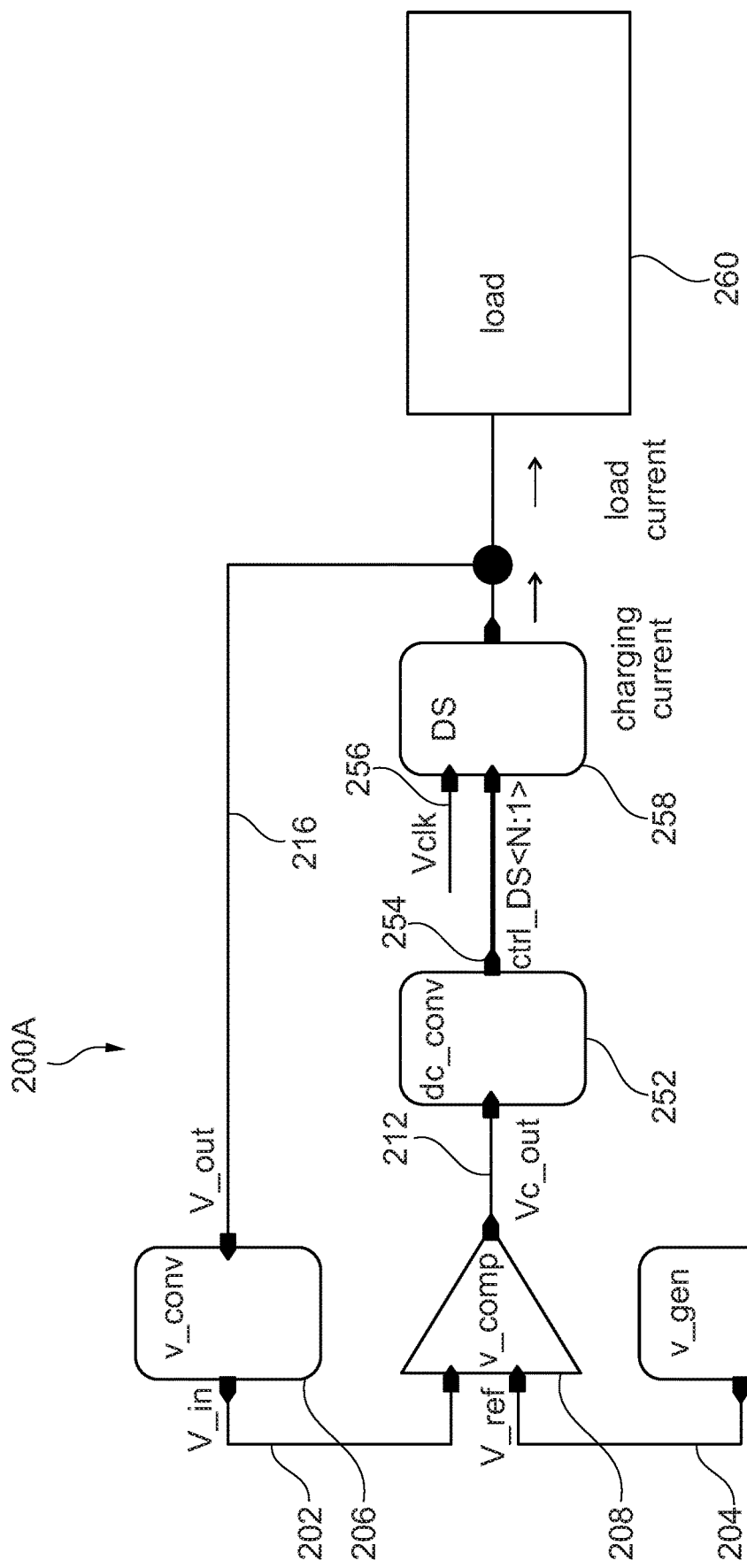
FIG. 2A is a schematic diagram of a regulated charge pump according to an embodiment of the present invention.

FIG. 2A is a schematic diagram of a regulated charge pump 200A, according to an embodiment of the invention, comprising a voltage comparator 208 having a first input (node 202) coupled to an output (node 216) of the regulated charge pump 200A, a second input (node 204) configured for receiving a reference voltage (V_ref), and an output (Vc_out) at node 212 for generating an output voltage representing a difference between a charging current of the regulated charge pump 200A and a load current of a load 260 coupled to the output of the regulated charge pump 200A; a first converter 252 (dc_conv) having an input coupled to the output of the comparator at node 212, and an output connected to a control bus 254 (ctrl_DS<N:1>) configured to indicate an adjustment of the charging current in response to the comparator output; and a driving stage 258 having a first input coupled to the control bus 254, and an output for providing the charging current at node 216, wherein the output of the driving stage 258 comprises the output of the regulated charge pump. In some embodiments, a second voltage converter 206 (v_conv) can convert the V_out voltage at node 216 into the Vin voltage at node 202. In some embodiments, the reference voltage V_ref can be provided at node 204 by a voltage generator 210 (v_gen). The voltage generator can comprise a bandgap voltage generator or other appropriate voltage generator.

In an embodiment of regulated charge pump 200A, the driving stage 258 includes a second input 256 configured for receiving a clock signal Vclk defining a clock cycle, wherein an amount of charge delivered to the output of the driving stage 258 per clock cycle defines a driving strength of the driving stage, wherein the driving strength is increased by the first converter 252 via the control bus 254bin response to a first value of the comparator output Vc_out, and wherein the driving strength is decreased by the first converter via the control bus in response to a second value of the comparator output. The first value can comprise for example, a logic one, and the second value can comprise for example, a logic zero.

In some embodiments, the regulated charge pump 200A can comprise a variable drive strength capability in a first feedback path and a fixed drive strength capability in a second feedback path as will be explained in further detail below.

Figure 2B:
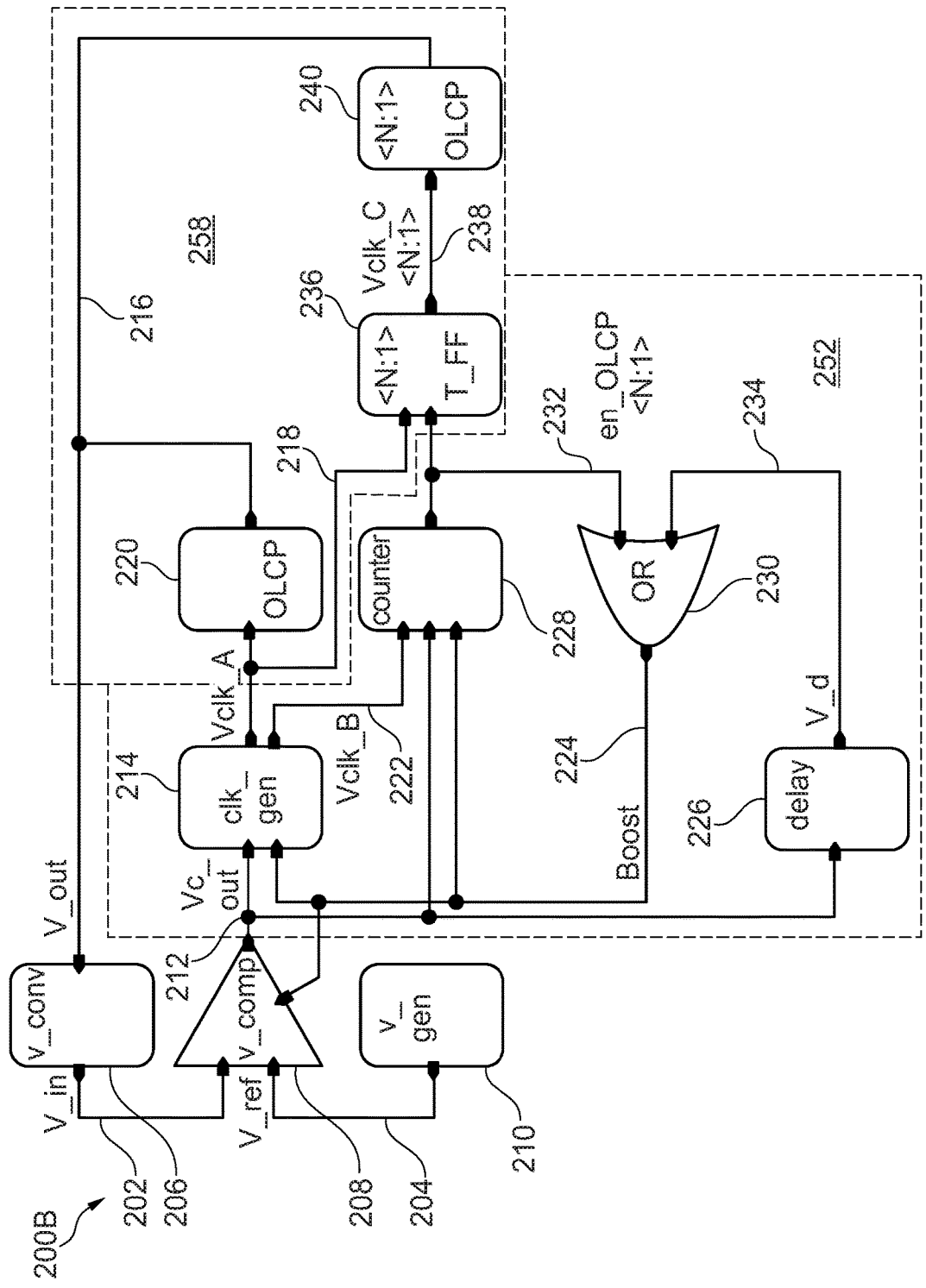
FIG. 2B is a detailed schematic diagram of a regulated charge pump according to an embodiment of the present invention.

FIG. 2B is a detailed schematic diagram of a regulated charge pump 200B according to an embodiment of the present invention. In particular, additional circuit details of the first converter 252 and the driving stage 258 are shown and described in detail below, according to an embodiment.

The regulated charge pump 200B comprises a voltage comparator 208 having a first input coupled to node 204 for receiving a reference voltage (V_ref), and a second input coupled to node 202; a clock signal generator 214 having an input coupled to an output of the voltage comparator at node 212 for receiving the voltage comparator output signal (Vc_out); a first open-loop charge pump 220 in a first feedback path having an input coupled to a first output (Vclk_A) of the clock signal generator 214, and an output at node 216 indirectly coupled to the second input of the voltage comparator 208; and a second open-loop charge pump 240 in a second feedback path having an input indirectly coupled to a second output (Vclk_B) of the clock signal generator 214, and an output indirectly coupled to the second input of the voltage comparator 208 at node 202, wherein the output of the first open-loop charge pump and the output of the second open-loop charge pump comprises an output of the regulated charge pump at node 216. The first and second feedback paths, and the indirect circuit coupling referred to above are discussed in further detail below along with their relationship to additional circuit components.

In the regulated charge pump 200B of FIG. 2B, the first output of the clock signal generator 214 is configured for providing a first clock signal (Vclk_A) having a first frequency, and wherein the second output of the clock signal generator 214 is configured for providing a second clock signal having a second frequency different from the first frequency. In an embodiment, the second frequency can be higher than the first frequency, and is available during a boost mode of operation that is discussed in further detail below.

In the regulated charge pump 200 of FIG. 2, a counter 228 is interposed between the second output (Vclk_B) of the clock signal generator 214 and the input of the second open-loop charge pump 240. Counter 228 also includes an input coupled to the output of the voltage comparator 208 at node 212, and an input for receiving the BOOST signal. The output of the counter is an N-bit digital bus 232 for providing an N-bit enable signal designated en_OLCP<N:1> for selectively enabling one or toggle flip-flops as will be described in further detail below.

The BOOST signal operates as an enable signal for the counter 228. When the BOOST signal=1 then the counter 228 can count. When BOOST=1, and the counter output (CO)=1 counter 228 counts up; when BOOST=1 and CO=0 counter 228 counts down. Counter 228 cannot count further if BOOST=1 and CO=1, and the maximum output value is reached. Similarly counter 228 cannot count further if BOOST=1 and CO=0, and the minimum output value (=0) is reached. The maximum and the minimum values are defined by the internal design of the counter 228.

When BOOST=0 the counter 228 cannot count and the output value will depend on the internal realization of counter 228. However, in an embodiment, the BOOST signal cannot be a "o" value until the counter output value reaches the minimum value (=0). This is due to the feedback from the counter output to the BOOST signal generation (through OR gate 230). Therefore, according to an embodiment, if BOOST=0 then the counter output=0 is guaranteed.

In the regulated charge pump 200 of FIG. 2, a plurality of "N" toggle flip-flops 236 is interposed between an output of the counter 228 and the input of the second open-loop charge pump 240. In an embodiment, the toggle (T) flip-flops operate as clock-blocking elements. When t=0 then the output of the T flip-flop keeps a constant state regardless of transitions of the input clock. When t=1 then each clock transition will cause a transition of the output state. In an embodiment the T flip-flop reacts on only one type of transition (0->1 or 1->0). In other embodiments the T flip-flop can be designed to react on any transition of the clock signal. Numerous types of flip-flops can be used as the basis for the toggle flip-flops 236.

The input clock pulse is provided by the first clock signal (Vclk_A) of clock signal generator 214. The individual toggle flip-flops are selectively enabled by enable signal en_OLCP<N:1> through digital bus 232. The output of toggle flip-flops 236 is an N-bit digital signal provided on bus 238 designated Vclk_C<N:1>. This signal is used to selectively provide the input clock signal to the second open-loop charge pump 240, which comprises a plurality of individually selectable open-loop charge pumps.

In the regulated charge pump 200 of FIG. 2, a voltage converter 206 is interposed between the output of the first open-loop charge pump 220 at node 216 and the second input of the voltage comparator 208 at node 202. The voltage converter 206 provides a linear function of the voltage at node 216 to node 202, which may also include an offset voltage in an embodiment. In addition, a voltage generator 210 is coupled to the first input of the voltage comparator 208 at node 204. The voltage generator may comprise a bandgap voltage generator or other types of voltage generator in embodiments.

The regulated charge pump 200 of FIG. 2, further comprising a logic gate 230 having a first input coupled to the output of the counter 228 for receiving the en_OLCP<N:1> enable signal, a second input indirectly coupled to the output of the voltage comparator 208, and an output 224 for generating the BOOST signal. The output is coupled to a boost input of the voltage comparator 208. In an embodiment, the BOOST signal=en_OLCP<1>||en_OLCP<2>|| . . . ||en_OLCP<N>||V_d, in other words OR gate 230 comprises N+1 inputs and each of N of them is directly connected to a bit of digital bus 232.

In an embodiment, the boost input of the voltage comparator 208 is configured for changing a bias current of the comparator in response to the BOOST signal as will be described in further detail below. In an embodiment, a delay element 226 is interposed between the output of the voltage comparator 208 and the second input of the logic gate at node 234. Thus, the delay element delays the Vc_out digital signal by a predetermined delay time to generate a delayed digital signal designated V_d at node 234. Finally, the logic gate 230 comprises an OR gate. In another embodiments, the response time of voltage comparator 208 can be decreased in various other ways; for example, by enabling of a second internal high-speed comparator and enabling outputting of its output voltage instead of the output voltage of the first steady-state low-power comparator.

FIG. 3 is a schematic diagram of a clock signal generator 214 for use in the regulated charge pump 200 of FIG. 2, according to an embodiment. Clock signal generator 214 comprises a modified ring oscillator including a plurality of serially coupled inverters including inverter 314, inverter 316, and inverter 320 for generating a clock signal. Only one clock signal (Vclk_A) is shown in the simplified circuit of FIG. 3. The second clock signal (Vclk_B) is enabled by the BOOST signal at high frequencies and is not shown in FIG. 3. While only three inverters are shown, and odd number of inverters can be used. A capacitor 318 is coupled between the input of inverter 314 and the output of inverter 316. Serially coupled resistors 322 and 324 are coupled between the output of inverter 320 and, indirectly, to the input of inverter 314. The clock signal generator 214 is selectively enabled by the voltage comparator output signal Vc_out, which is received by the input of inverters 302 and 306, and a non-inverting control input of transmission gates 304 and 310. The output of inverter 302 is coupled to the inverting control input of transmission gate 304, and the output of inverter 306 is coupled to the inverting control input of transmission gate 310. Transmission gate 304 is coupled between the input of inverter 314 and resistor 324. Transmission gate 304 is thus used to selectively interrupt the generation of the clock signal. Transmission gate 310 is coupled between the input of inverter 313 and the output of inverter 316. Transmission gate 310 is thus used to selectively discharge capacitor 318 and further prevent generation of the clock signal. In addition, the frequency of the clock signal generator 214 can be selectively increased by shorting resistor 322. This is accomplished through transmission gate 326, which is coupled across resistor 322. The non-inverting control input of transmission gate 326 and the input of inverter receives the BOOST signal. The inverting control input of transmission gate 326 receives an inverted BOOST signal from the output of inverter 328.

Figure 4:
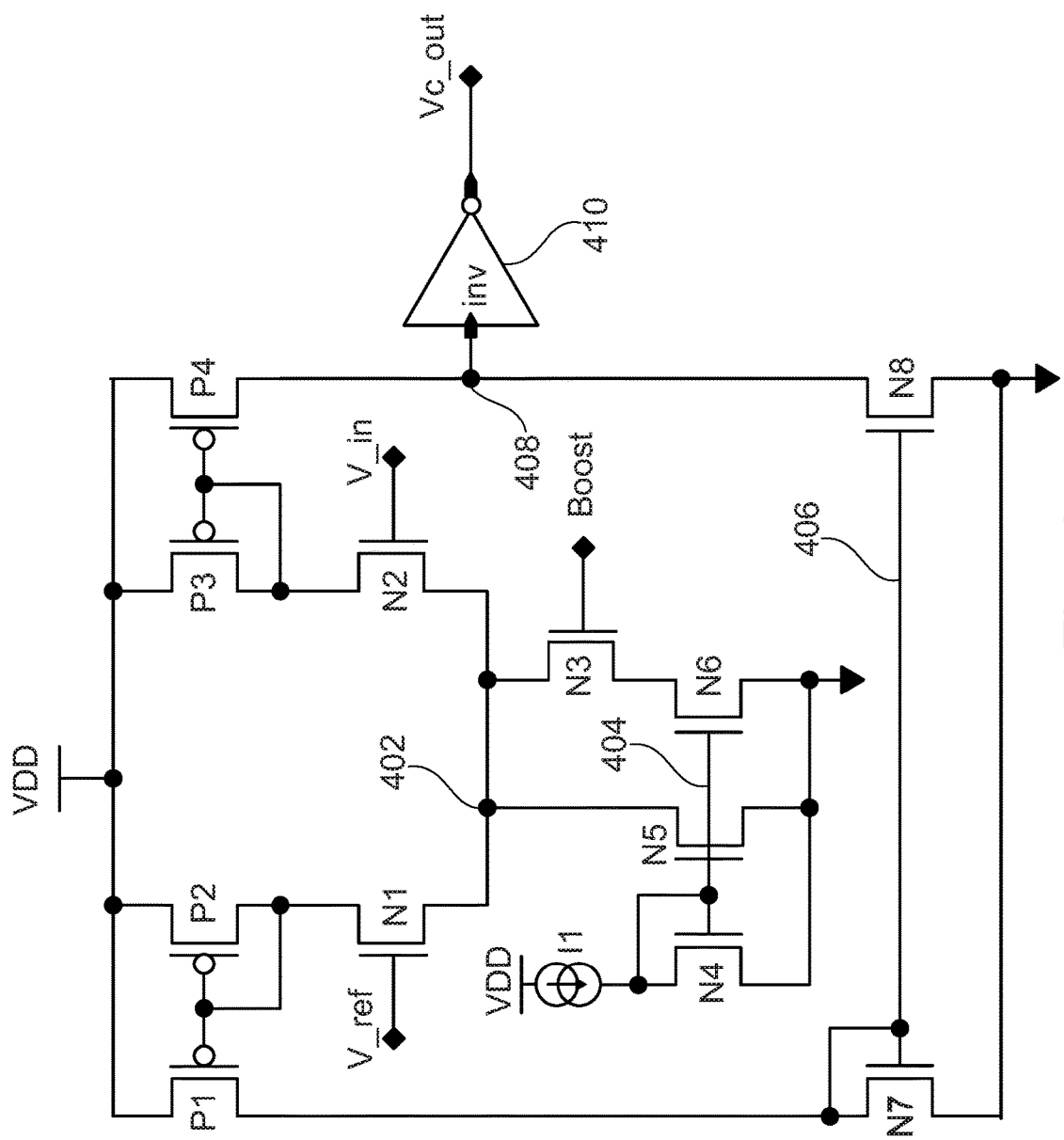
FIG. 4 is a schematic diagram of a comparator for use in the regulated charge pump of FIG. 2.

FIG. 4 is a schematic diagram of a voltage comparator 208 for use in the regulated charge pump 200 of FIG. 2, according to an embodiment. Voltage comparator 208 comprises a differential pair of n-channel transistors N1 and N2. The gate of transistor N1 receives the V_ref voltage reference, and the gate of transistor receives the Vin input voltage. The sources of transistors N1 and N2 receive a bias current at node 402 from a bias current generator comprising current source I1 and a current mirror including n-channel transistors N3, N4, N5, and N6. The gates of transistors N3, N4, N5, and N6 are coupled to node 404, and the sources of transistors N3, N4, N5, and N6 are coupled to ground or another reference voltage source. Transistor N4 has a coupled drain and gate for receiving the current of current source I1. This current is mirrored by transistor N5, whose drain is coupled to node 402. An additional bias current is provided by transistors N3 and N6, under the control of the BOOST signal. While transistor N6 also mirrors the current of current source I1, the drain current can only be applied to node 402 if the current path of transistor N3 is enabled. The current path is selectively enabled by BOOST signal being applied to the gate of transistor N3. Transistors N5 and N6 can be of the same or different sizes to provide different value bias currents as desired for a particular application.

The load for transistor N1 comprises a p-channel current mirror including transistors P1 and P2, wherein the input of the current mirror is coupled to the drain of transistor N1. The coupled gate and drain of transistor P2 comprises the input of the current mirror, and the drain of transistor P1 comprises the output of the current mirror. The load for transistor N2 also comprises a p-channel current mirror including transistors P3 and P4, wherein the input of the current mirror is coupled to the drain of transistor N2. The coupled gate and drain of transistor P3 comprises the input of the current mirror, and the drain of transistor P1 comprises the output of the current mirror. The sources of transistors P1, P2, P3, and P4 are coupled to the power supply voltage source VDD. The drain of transistor P1 is coupled to an input of an n-channel current mirror comprising transistors N7 and N8. The drain of transistor P4 is coupled to an output of the n-channel current mirror comprising transistors N7 and N8. The gates of transistors N7 and N8 are coupled together at node 406. The sources of transistors N7 and N9 are coupled to ground or another source of reference voltage. The drain of n-channel transistor N8 and the drain of P-channel transistor are coupled together 408. An input of inverter 410 is coupled to 408, and the output of inverter 410 generates the voltage comparator output signal (Vc_out).

Figure 5:
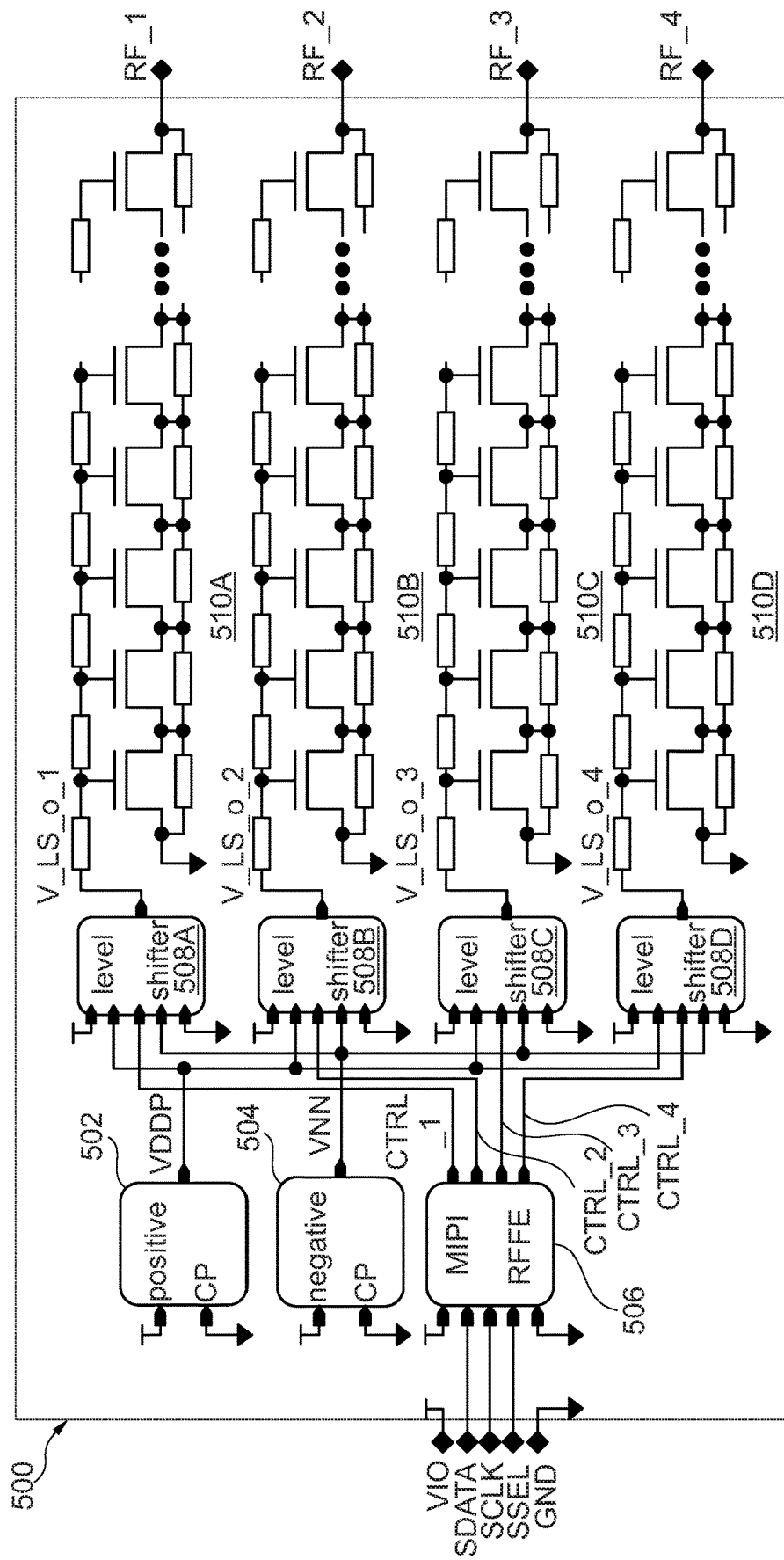
FIG. 5 is a schematic diagram of a radio frequency (RF) switch product using the regulated charge pump of FIG. 2.

FIG. 5 is a schematic diagram of a radio frequency (RF) switch product 500 using the regulated charge pump 200 of FIG. 2, according to an embodiment. RF switch product 500 can comprise one or more integrated circuits. RF switch product 500 includes a positive regulated charge pump 502 for providing a positive charge pump voltage VDDP, and a negative regulated charge pump 504 for providing a negative charge pump voltage VNN, according to embodiments. Positive regulated charge pump 502 comprises a regulated charge pump such as regulated charge pump 200 of FIG. 2 that has been configured to provide a positive charge pump voltage by, for example, adjusting the value of voltage generator 210 to have a desired positive reference voltage value. Correspondingly, negative regulated charge pump 504 comprises a regulated charge pump such as regulated charge pump 200 of FIG. 2 that has been configured to provide a negative charge pump voltage by, for example, adjusting the value of voltage generator 210 to have a desired negative reference voltage value, as well as adjusting the pumping stage circuits to generate a negative charge pump voltage. Positive regulated charge pump 502 and negative regulated charge pump 504 are both coupled between a power supply voltage and ground.

RF switch product 500 also includes a control interface 506. In an embodiment, control interface 506 is a Mobile Industry Processor Interface (MIPI) RF Front End (RFFE) Control Interface, which is a standard interface for control of radio frequency (RF) front-end (FE) subsystems. Control interface 506 is also coupled between a power supply voltage and ground, and is coupled to a number of external integrated circuit pins. These pins includes a VIO level shift input pin, which is a reference voltage for the digital input and output pins; an SDATA pin, for receiving data; an SCLK pin, for receiving an input clock signal; an SSEL pin, which is a user identification select pin; and a GND pin, which is the ground pin. Additional pins of RF switch product include RF switch output pins RF_1, RF_2, RF_3, and RF_4. Not all external pins are illustrated in FIG. 5 for clarity, and other pins can be used as desired. Control interface also comprises a number of internal control signal outputs including CTRL_1, CTRL_2, CTRL_3, and CTRL_4.

RF switch product 500 also includes a plurality of level shifters 508A, 508B, 508C, and 508D. Each level shifter is coupled between a power supply and ground, and receives the VDDP charge pump voltage, the VNN charge pump voltage, and one of the control signal outputs CTRL_1, CTRL_2, CTRL_3, or CTRL_4. Level shifter 508A generates an output voltage designated V_LS_0_1 for controlling a first RF switch 510A coupled to the RF_1 external pin; level shifter 508B generates an output voltage designated V_LS_0_2 for controlling a second RF switch 510B coupled to the RF_2 external pin; level shifter 508C generates an output voltage designated V_LS_0_3 for controlling a third RF switch 510C coupled to the RF_3 external pin; and level shifter 508D generates an output voltage designated V_LS_0_4 for controlling a fourth RF switch 510D coupled to the RF_4 external pin. In an embodiment, each RF switch is a stacked transistor RF switch for withstanding high voltages, comprising a plurality of stacked transistors in series, a plurality of gate biasing transistors coupled in series, and a plurality of source/drain biasing transistors coupled in series. RF switch product 500 is but one example of an integrated circuit product that can benefit from using the regulated charge pump described herein. Many other RF switch products, as well as other integrated circuit products can also use the regulated charge pump 200 shown in FIG. 2.

Figure 6:
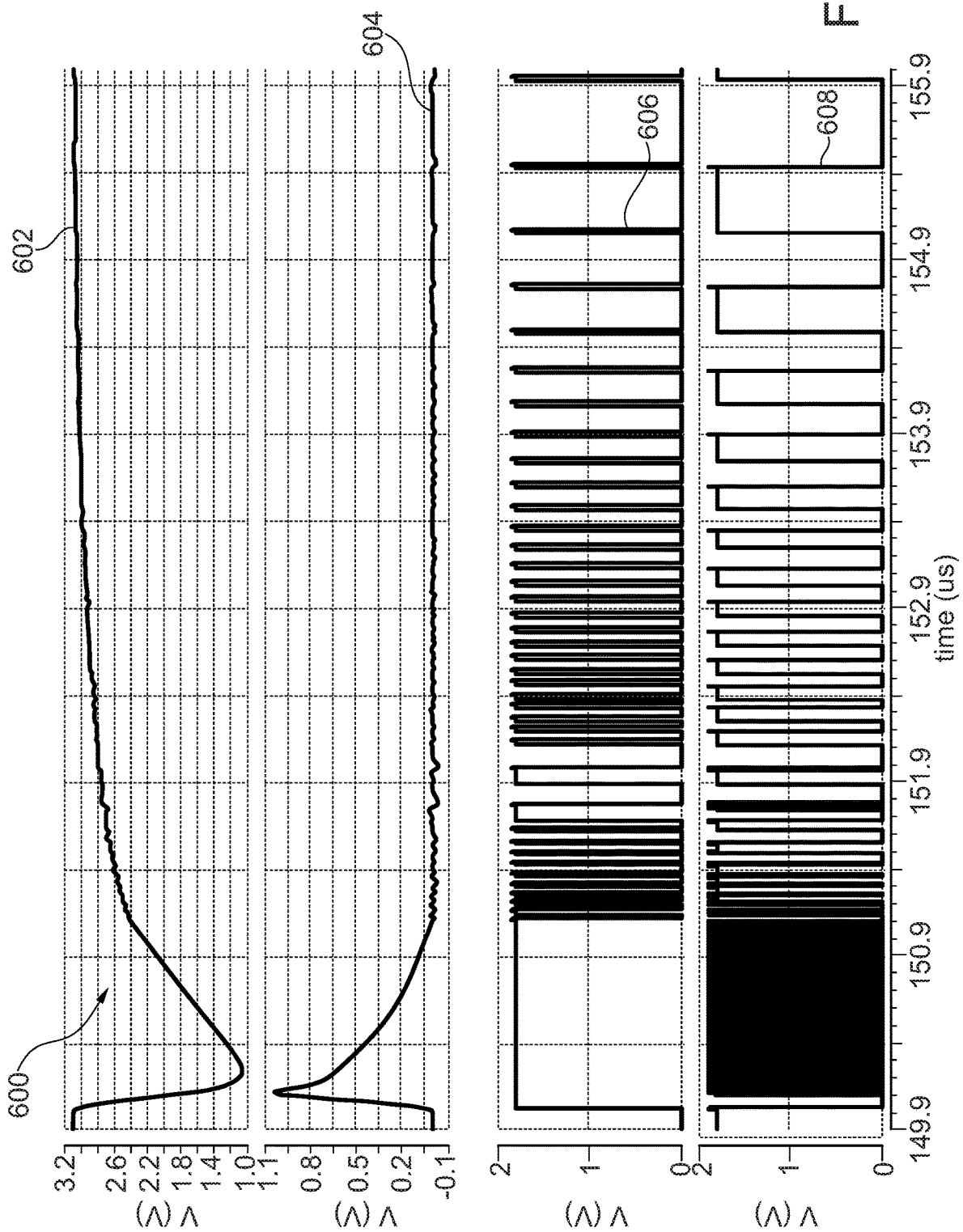
FIG. 6 is a timing diagram associated with the exemplary regulated charge pump of FIG. 1.

FIG. 6 is a timing diagram 600 associated with the exemplary regulated charge pump 100 of FIG. 1, showing four voltage signal waveforms measured in volts versus time measured microseconds. The four voltage signal waveforms include the voltage output (V_out) waveform 602, the input voltage (V_in) minus the voltage reference (V_ref) waveform 604, the voltage comparator output signal (Vc_out) waveform 606, and the voltage clock signal (Vclk) waveform 608. While the voltage output waveform 602 quickly converges to the final voltage output value (after a load current pulse is received), note that there is a significant undershoot with the voltage output waveform 602 dropping from an initial value of about three volts down to a peak undershoot value of about one volts.

Figure 7:
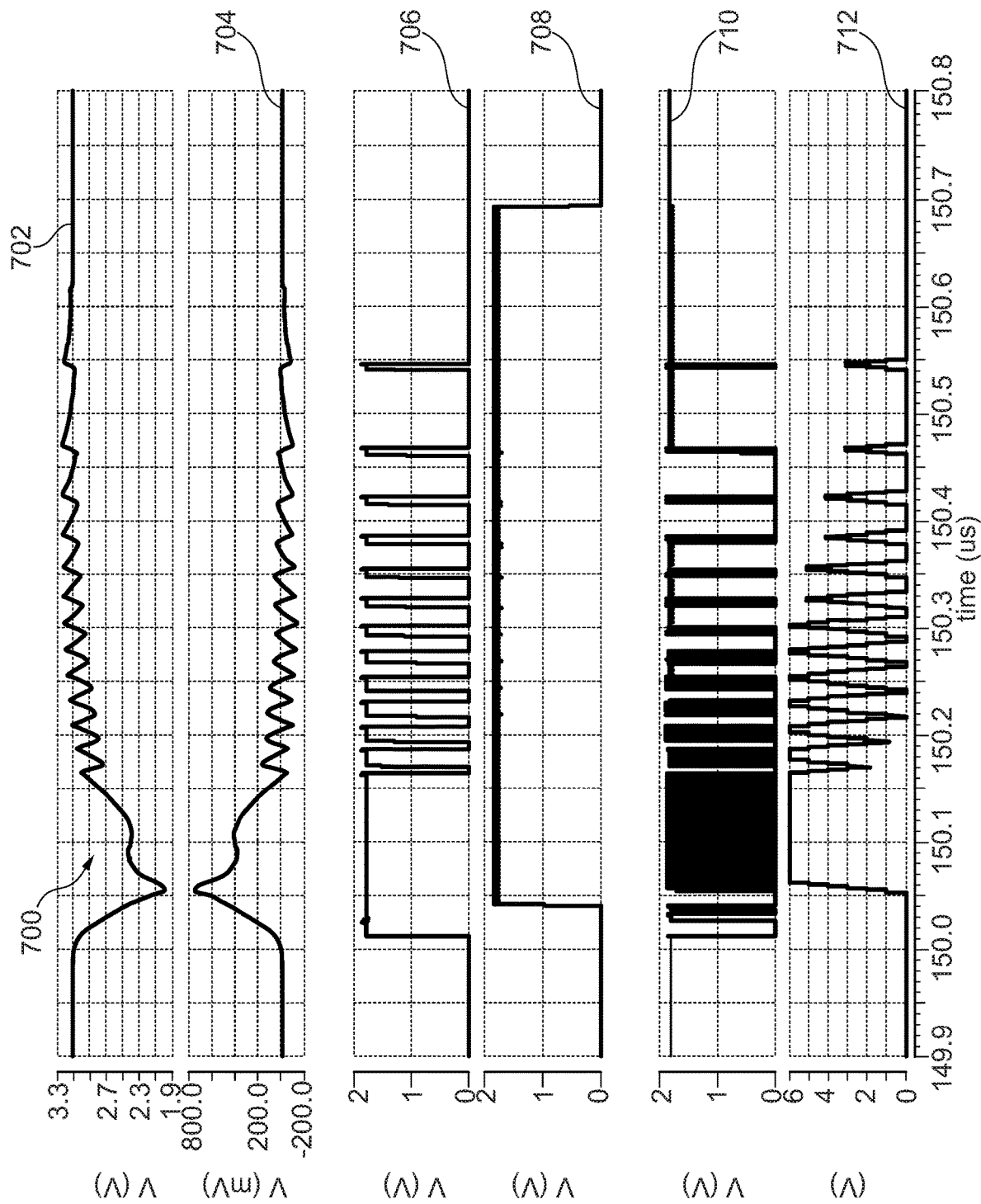
FIG. 7 is a timing diagram associated with the regulated charge pump of FIG. 2.

FIG. 7 is a timing diagram 700 associated with the regulated charge pump 200 of FIG. 2, showing six voltage signal waveforms measured in volts versus time measured microseconds. The six voltage signal waveforms include the voltage output (V_out) waveform 702, the input voltage (V_in) minus the voltage reference (V_ref) waveform 704, the voltage comparator output signal (Vc_out) waveform 706, the BOOST signal waveform 708, the first voltage clock signal (Vclk_A) waveform 710, and the en_OLCP<N: 1> enable signal waveform 712. While the voltage output waveform 702 quickly converges to the final voltage output value (after a load current pulse is received), note that there is less undershoot as compared to the exemplary charge pump, with the voltage output waveform 702 dropping from an initial value of about three volts down to a peak undershoot value of about two volts. This is due in part to the delayed BOOST signal waveform 708, and the resulting initial pulse skipping of the first voltage clock signal waveform 710. In an embodiment, Vclk_A is a pulsed-skipped version of the clock, while Vclk_B fills the whole width of the BOOST pulse with a high-frequency clock signal and keeps a constant state outside of the pulse.

Figure 8:
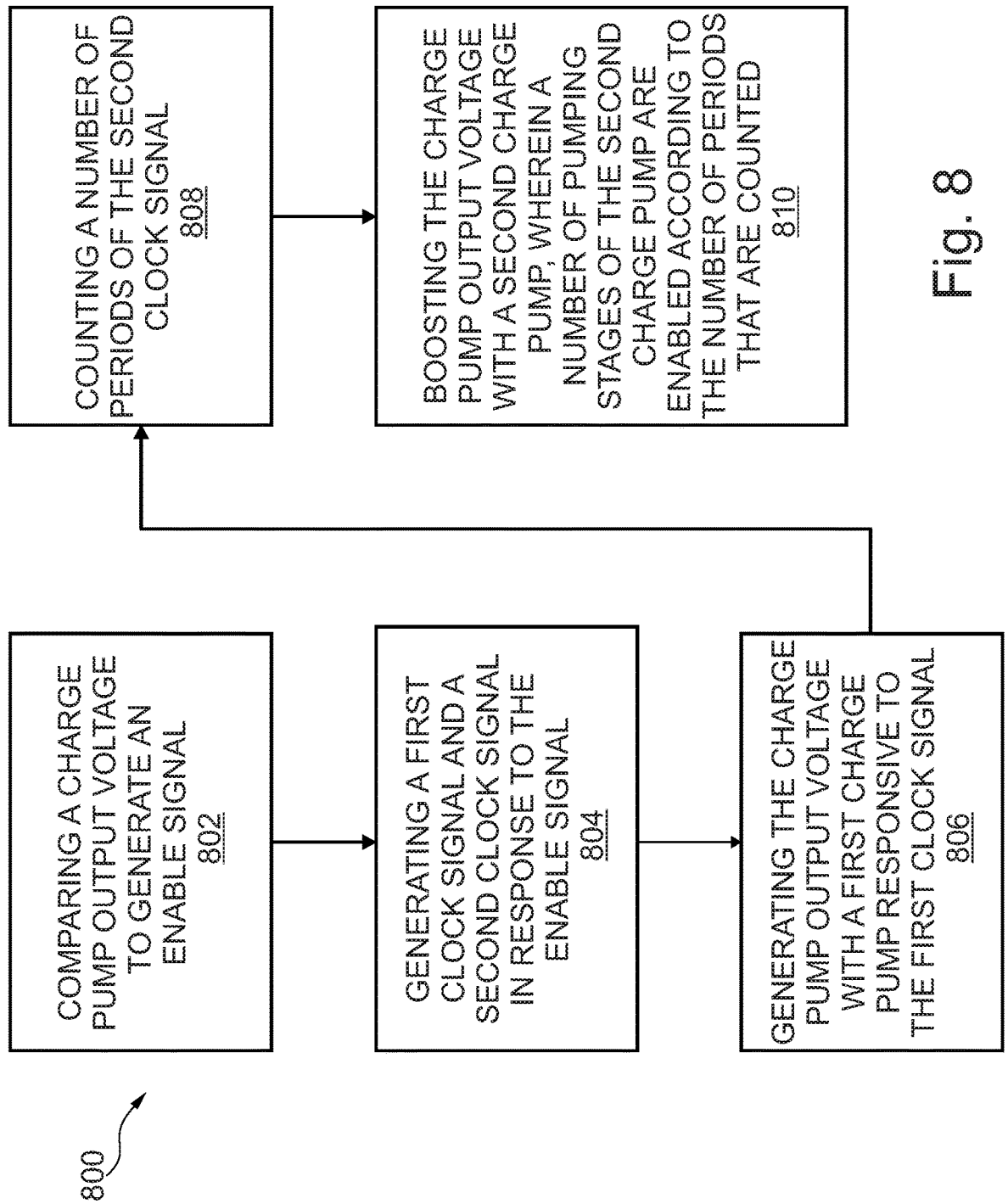
FIG. 8 is flowchart of a method according to an embodiment of the invention.

According to an embodiment, a method 800 of operating a charge pump is shown in FIG. 8, comprising comparing a charge pump output voltage to a reference voltage to generate an enable signal at step 802; generating a first clock signal and a second clock signal in response to the enable signal at step 804; generating the charge pump output voltage with a first charge pump responsive to the first clock signal at step 806; counting a number of periods of the second clock signal at step 808; and boosting the charge pump output voltage with a second charge pump, wherein a number of pumping stages of the second charge pump are enabled according to the number of periods that are counted at step 810.

Example embodiments of the present invention are summarized here. Other embodiments can also be understood from the entirety of the specification and the claims filed herein.

Example 1. According to an embodiment, a regulated charge pump includes a comparator having a first input coupled to an output of the regulated charge pump, a second input configured for receiving a reference voltage, and an output for generating an output voltage representing a difference between a charging current of the regulated charge pump and a load current of a load coupled to the output of the regulated charge pump; a first converter having an input coupled to the output of the comparator, and an output connected to a control bus configured to indicate an adjustment of the charging current in response to the comparator output; and a driving stage having a first input coupled to the control bus, and an output for providing the charging current, wherein the output of the driving stage includes the output of the regulated charge pump.

Example 2. The regulated charge pump of Example 1, wherein the driving stage includes a second input configured for receiving a clock signal defining a clock cycle, wherein an amount of charge delivered to the output of the driving stage per clock cycle defines a driving strength of the driving stage, wherein the driving strength is increased by the first converter via the control bus in response to a first value of the comparator output, and wherein the driving strength is decreased by the first converter via the control bus in response to a second value of the comparator output.

Example 3. The regulated charge pump of any of the above examples, further including a variable drive strength capability in a first feedback path and a fixed drive strength capability in a second feedback path.

Example 4. According to an embodiment, a regulated charge pump includes a comparator having a first input and a second input for receiving a reference voltage; a clock generator having an input coupled to an output of the comparator; a first open-loop charge pump in a first feedback path having an input coupled to a first output of the clock generator, and an output coupled to the second input of the comparator; and a second open-loop charge pump in a second feedback path having an input coupled to a second output of the clock generator, and an output coupled to the second input of the comparator, wherein the output of the first open-loop charge pump and the output of the second open-loop charge pump includes an output of the regulated charge pump.

Example 5. The regulated charge pump of Example 4, wherein the first output of the clock generator is configured for providing a first clock signal having a first frequency, and wherein the second output of the clock generator is configured for providing a second clock signal having a second frequency different from the first frequency.

Example 6. The regulated charge pump of any of the above examples, further including a counter interposed between the second output of the clock generator and the input of the second open-loop charge pump.

Example 7. The regulated charge pump of any of the above examples, further including a plurality of toggle flip-flops interposed between an output of the counter and the input of the second open-loop charge pump.

Example 8. The regulated charge pump of any of the above examples, wherein the second open-loop charge pump includes a plurality of individually selectable open-loop charge pumps.

Example 9. The regulated charge pump of any of the above examples, further including a voltage converter interposed between the output of the first open-loop charge pump and the second input of the comparator.

Example 10. The regulated charge pump of any of the above examples, further including a voltage generator coupled to the first input of the comparator.

Example 11. The regulated charge pump of any of the above examples, further including a logic gate having a first input coupled to the output of the counter, a second input coupled to the output of the comparator, and an output coupled to a boost input of the comparator.

Example 12. The regulated charge pump of any of the above examples, wherein the boost input of the comparator is configured for changing a bias current of the comparator.

Example 13. The regulated charge pump of any of the above examples, further including a delay element interposed between the output of the comparator and the second input of the logic gate.

Example 14. The regulated charge pump of any of the above examples, wherein the logic gate includes an OR gate.

Example 15. An integrated circuit including a control interface coupled to a first plurality of integrated circuit pins; a plurality of level shifters coupled to the control interface; a plurality of radio frequency (RF) switches respectively coupled between the plurality of level shifters and a second plurality of integrated circuit pins; and at least one regulated charge pump coupled to the plurality of level shifters, wherein the at least one regulated charge pump includes the regulated charge pump of Example 4.

Example 16. According to an embodiment, a method includes comparing a charge pump output voltage to a reference voltage to generate an enable signal; generating a first clock signal and a second clock signal in response to the enable signal; generating the charge pump output voltage with a first charge pump responsive to the first clock signal; counting a number of periods of the second clock signal; and boosting a driving strength of the first charge pump with a second charge pump, wherein a number of pumping stages of the second charge pump are enabled according to the number of periods that are counted.

Example 17. The method of Example 16, further including generating a boost signal during a boost mode of operation of the second charge pump.

Example 18. The method of any of the above examples, further including generating the boost signal when the enable signal is high or low for a time period greater than a predetermined delay time period.

Example 19. The method of any of the above examples, wherein the boost signal increases a speed of comparing the charge pump output voltage to the reference voltage to generate the enable signal.

Example 20. The method of any of the above examples, wherein the boost signal increases a frequency of at least one of the first clock signal and the second clock signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A regulated charge pump comprising:
   an amplifier having first and second inputs, the second input configured to receive a reference voltage;
   a clock generator having an input coupled to an output of the amplifier;
   a first open-loop charge pump in a first feedback path having an input coupled to a first output of the clock generator, and an output coupled to the first input of the amplifier; and
   a second open-loop charge pump in a second feedback path having an input coupled to a second output of the clock generator, and an output coupled to the first input of the amplifier,
   wherein an output of the regulated charge pump comprises the output of the first open-loop charge pump and the output of the second open-loop charge pump, and wherein the first output of the clock generator is configured for providing a first clock signal having a first frequency, and wherein the second output of the clock generator is configured for providing a second clock signal having a second frequency different from the first frequency.

2. The regulated charge pump of claim 1, further comprising a counter interposed between the second output of the clock generator and the input of the second open-loop charge pump.

3. The regulated charge pump of claim 2, further comprising a plurality of toggle flip-flops interposed between an output of the counter and the input of the second open-loop charge pump.

4. The regulated charge pump of claim 1, wherein the second open-loop charge pump comprises a plurality of individually selectable open-loop charge pumps.

5. The regulated charge pump of claim 1, further comprising a voltage converter interposed between the output of the first open-loop charge pump and the first input of the amplifier.

6. The regulated charge pump of claim 1, further comprising a voltage generator coupled to the second input of the amplifier.

7. The regulated charge pump of claim 2, further comprising a logic gate having a first input coupled to an output of the counter, a second input coupled to the output of the amplifier, and an output coupled to a boost input of the amplifier.

8. The regulated charge pump of claim 7, wherein the boost input of the amplifier is configured for changing a bias current of the amplifier.

9. The regulated charge pump of claim 7, further comprising a delay element interposed between the output of the amplifier and the second input of the logic gate.

10. The regulated charge pump of claim 7, wherein the logic gate comprises an OR gate.

11. An integrated circuit comprising:
a control interface coupled to a first plurality of integrated circuit pins;
a plurality of level shifters coupled to the control interface;
a plurality of radio frequency (RF) switches respectively coupled between the plurality of level shifters and a second plurality of integrated circuit pins; and
at least one regulated charge pump coupled to the plurality of level shifters, wherein the at least one regulated charge pump comprises:
an amplifier having first and second inputs, the second input configured to receive a reference voltage;
a clock generator having an input coupled to an output of the amplifier;
a first open-loop charge pump in a first feedback path having an input coupled to a first output of the clock generator, and an output coupled to the first input of the amplifier; and
a second open-loop charge pump in a second feedback path having an input coupled to a second output of the clock generator, and an output coupled to the first input of the amplifier,
wherein an output of the regulated charge pump comprises the output of the first open-loop charge pump and the output of the second open-loop charge pump, wherein the first output of the clock generator is configured for providing a first clock signal having a first frequency, and wherein the second output of the clock generator is configured for providing a second clock signal having a second frequency different from the first frequency.

12. The integrated circuit of claim 11, wherein the at least one regulated charge pump further comprises a counter interposed between the second output of the clock generator and the input of the second open-loop charge pump.

13. The integrated circuit of claim 12, wherein the at least one regulated charge pump further comprises a plurality of toggle flip-flops interposed between an output of the counter and the input of the second open-loop charge pump.

14. The integrated circuit of claim 11, wherein the second open-loop charge pump of the at least one regulated charge pump comprises a plurality of individually selectable open-loop charge pumps.

15. The integrated circuit of claim 11, wherein the at least one regulated charge pump further comprises a voltage converter interposed between the output of the first open-loop charge pump and the first input of the amplifier.

16. A method comprising:
amplifying a difference between a charge pump output voltage and a reference voltage to generate an enable signal;
generating a first clock signal and a second clock signal in response to the enable signal;
generating the charge pump output voltage with a first charge pump responsive to the first clock signal;
counting a number of periods of the second clock signal; and
boosting a driving strength of the first charge pump with a second charge pump, wherein a number of pumping stages of the second charge pump are enabled according to the number of periods that are counted.

17. The method of claim 16, further comprising generating a boost signal during a boost mode of operation of the second charge pump.

18. The method of claim 17, further comprising generating the boost signal when the enable signal is high or low for a time period greater than a predetermined delay time period.

19. The method of claim 17, wherein the boost signal increases a speed of amplifying the difference between the charge pump output voltage and the reference voltage to generate the enable signal.

20. The method of claim 17, wherein the boost signal increases a frequency of at least one of the first clock signal and the second clock signal.

* * * * *